(12) United States Patent
Kim et al.

(10) Patent No.: US 7,667,673 B2
(45) Date of Patent: *Feb. 23, 2010

(54) ORGANIC ELECTROLUMINESCENT DISPLAY PANEL

(75) Inventors: Keum-Nam Kim, Suwon-si (KR); Ul-Ho Lee, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 56 days.

This patent is subject to a terminal disclaimer.

(21) Appl. No.: 10/971,678

(22) Filed: Oct. 22, 2004

(65) Prior Publication Data

US 2005/0093789 A1 May 5, 2005

(30) Foreign Application Priority Data

Oct. 29, 2003 (KR) .................. 10-2003-0075988

(51) Int. Cl.
*G09G 3/30* (2006.01)
(52) U.S. Cl. .................. 345/76; 315/169.3; 313/238
(58) Field of Classification Search ............. 345/76–83, 345/87–103, 204–205, 208–210; 315/169.1, 315/169.3; 313/238, 326
See application file for complete search history.

(56) References Cited

U.S. PATENT DOCUMENTS

| 5,426,447 | A | 6/1995 | Lee |
| 5,510,807 | A | 4/1996 | Lee et al. |
| 5,686,936 | A | 11/1997 | Maekawa et al. |
| 5,708,454 | A | 1/1998 | Katoh et al. |
| 6,229,506 | B1 | 5/2001 | Dawson et al. |
| 6,229,508 | B1 * | 5/2001 | Kane .................. 345/82 |
| 6,362,798 | B1 | 3/2002 | Kimura et al. |

(Continued)

FOREIGN PATENT DOCUMENTS

CN 1242563 A 1/2000

(Continued)

OTHER PUBLICATIONS

European Search Report for Application No. EP 03 00 6113, Jan. 18, 2005, 2 pages.

(Continued)

*Primary Examiner*—Amr Awad
*Assistant Examiner*—Stephen G Sherman
(74) *Attorney, Agent, or Firm*—Christie, Parker & Hale, LLP

(57) ABSTRACT

An organic EL display panel having display pixels with an improved aperture ratio. A display pixel includes a control electrode line coupled to control electrodes of first and second transistors and a main electrode of a fourth transistor, and a power electrode line provided substantially in parallel with a data line and coupled to a main electrode of the first transistor. Channels of the first and second transistors are formed substantially in parallel with a scan line. A node of the control electrode line for coupling the control electrodes of the first and second transistors is arranged in a direction substantially perpendicular to that of the scan line, and a portion of the control electrode line extended to the main electrode of the fourth transistor is formed substantially in parallel with the power electrode line in a substantially vertical direction, and forms a capacitor together with the power electrode line.

19 Claims, 3 Drawing Sheets

U.S. PATENT DOCUMENTS

| | | | |
|---|---|---|---|
| 6,369,786 B1 * | 4/2002 | Suzuki | 345/77 |
| 6,420,834 B2 * | 7/2002 | Yamazaki et al. | 315/169.3 |
| 6,469,318 B2 * | 10/2002 | Yamada et al. | 257/59 |
| 6,501,448 B1 * | 12/2002 | Komiya et al. | 345/80 |
| 6,580,408 B1 * | 6/2003 | Bae et al. | 345/76 |
| 6,650,060 B2 * | 11/2003 | Okuda | 315/169.1 |
| 6,731,266 B1 | 5/2004 | Jung | |
| 6,760,005 B2 * | 7/2004 | Koyama et al. | 345/98 |
| 6,791,129 B2 * | 9/2004 | Inukai | 257/208 |
| 6,809,482 B2 * | 10/2004 | Koyama | 315/169.3 |
| 6,859,193 B1 | 2/2005 | Yumoto | |
| 6,989,826 B2 | 1/2006 | Kasai | |
| 7,015,884 B2 | 3/2006 | Kwon | |
| 7,224,334 B2 | 5/2007 | Choi et al. | |
| 2002/0047581 A1 | 4/2002 | Koyama | |
| 2002/0118150 A1 | 8/2002 | Kwon | |
| 2003/0179164 A1 | 9/2003 | Shin et al. | |
| 2004/0041769 A1 | 3/2004 | Yamashita et al. | |
| 2004/0217925 A1 | 11/2004 | Chung et al. | |

FOREIGN PATENT DOCUMENTS

| | | |
|---|---|---|
| CN | 1361510 A | 7/2002 |
| EP | 0 905 673 A1 | 3/1999 |
| EP | 1 220 191 A2 | 7/2002 |
| EP | 1 220 191 A3 | 9/2002 |
| JP | 02082295 A | 3/1990 |
| JP | 11-272233 | 10/1999 |
| JP | 2002-351401 | 12/2002 |
| JP | 2004-118196 | 4/2004 |
| WO | WO 01/06484 A1 | 1/2001 |

OTHER PUBLICATIONS

Patent Abstracts of Japan, Publication No. 11-272233, dated Oct. 8, 1999, in the name of Mitsumi Kimura et al.

* cited by examiner

ORGANIC ELECTROLUMINESCENT DISPLAY PANEL

CROSS REFERENCE TO RELATED APPLICATION

This application claims priority to and the benefit of Korea Patent Application No. 2003-75988 filed on Oct. 29, 2003 in the Korean Intellectual Property Office, the entire content of which is incorporated herein by reference.

BACKGROUND OF THE INVENTION (a) Field of the Invention

The present invention relates to a video display. More specifically, the present invention relates to an organic electroluminescent (EL) display panel.

(b) Description of the Related Art

In general, an organic EL display electrically excites a phosphorous organic compound to emit light. A light emitting pixel includes an anode (ITO), an organic thin film, and a cathode layer (metal). The organic thin film has a multi-layer structure including an EML (emitting layer), an ETL (electron transport layer), and an HTL (hole transport layer) for maintaining balance between electrons and holes and improving emitting efficiencies. The organic thin film further includes an EIL (electron injecting layer) and an HIL (hole injecting layer).

The organic emitting cells are arranged in an nxm matrix format to configure an organic EL display panel which displays video data by voltage or current-driving.

FIG. 1 shows a brief diagram of a general organic EL display.

As shown, the organic EL display includes an organic EL display panel 10, a scan driver 20, and a data driver 30.

The organic EL display panel 10 includes a plurality of data lines $D_1$ to $D_m$ extending in a column direction and arranged in a row direction, a plurality of scan lines $S_1$ to $S_n$ extending in the row direction and arranged in the column direction, and a plurality of pixel circuits 11. The data lines $D_1$ to $D_m$ transmit data voltages for displaying video signals to the pixel circuits 11, and the scan lines $S_1$ to $S_n$ transmit select voltages for selecting the pixel circuits 11 to the pixel circuits 11. The pixel circuits 11 are formed at pixel areas, each of which is defined by two neighboring data lines and two neighboring scan lines.

The scan driver 20 sequentially applies the select signals to the scan lines $S_1$ to $S_n$, and the data driver 30 applies the data voltages for displaying the video signals to the data lines $D_1$ to $D_m$.

Methods for driving the organic emitting cells through the pixel circuits 11 include a passive matrix method, and an active matrix method which uses thin-film transistors (TFTs). The passive matrix method forms anodes and cathodes to cross each other, selects lines, and drives the organic emitting cells, and the active matrix method uses the TFTs to select lines, stores data in capacitors of the pixels, and drives the organic emitting cells.

U.S. Patent Publication No. 2002/0118150 discloses a pixel circuit with four transistors for the organic EL display based on the active matrix method.

A driving transistor transmits the current which corresponds to a voltage between a gate and a source to an organic EL element (OLED). A capacitor is connected between the gate and the source of the driving transistor. A compensation transistor for compensating for a threshold voltage of the driving transistor is diode-connected, and its gate is coupled to the gate of the driving transistor. A switching transistor which has a gate coupled to a current scan line and a source coupled to a data line applies the data voltage to a source of the compensation transistor in response to the select signal of the current scan line. A pre-charge transistor which has a gate coupled to a previous scan line applies a pre-charge voltage to the gate of the driving transistor in response to the select signal of the previous scan line.

In order to make the threshold voltages at the driving transistor and the compensation transistor substantially the same in the above-described pixel circuit, the driving transistor and the compensation transistor are arranged in parallel with the data lines. The pre-charge transistor is arranged to be coupled to a previous scan line.

However, the above-mentioned arrangement has a problem of reducing the aperture ratio of display pixels since the area of gate lines for coupling a drain of the pre-charge transistor, the gate of the driving transistor, and the gate of the compensation transistor is increased.

SUMMARY OF THE INVENTION

In exemplary embodiments of the present invention, is provided an organic EL display panel having an arrangement configuration that provides a better aperture ratio to display pixels.

According to an exemplary embodiment of the present invention, an organic EL display panel includes a pixel circuit which includes a first transistor having a main electrode and a control electrode. The first transistor is configured to output a current corresponding to a voltage between the main electrode and the control electrode to a display element. A capacitor is formed between the main electrode and the control electrode. The pixel circuit also includes a second transistor having a control electrode coupled to the control electrode of the first transistor, and a third transistor for applying a data line voltage from a data line to the second transistor in response to a select signal provided by a current scan line. The organic EL display panel includes a control electrode line having a node substantially aligned with and coupled to the control electrode of the first transistor and the control electrode of the second transistor, and a power electrode line provided substantially in parallel with the data line, and coupled to the main electrode of the first transistor. A channel of the first transistor and a channel of the second transistor are formed substantially in parallel with the current scan line.

The node of the control electrode line for coupling the control electrode of the first transistor to the control electrode of the second transistor may be provided in a direction substantially perpendicular to that of the current scan line.

At least a portion of the control electrode line may be formed substantially in parallel with the power electrode line and may be operated together with a corresponding portion of the power electrode line as the capacitor.

The capacitor may be formed substantially in parallel with the data line, and the display element may be disposed between the capacitor and the data line.

The organic EL display panel may further include a fourth transistor for applying a pre-charge voltage to a main electrode of the second transistor and the control electrode of the first transistor in response to a control signal.

The fourth transistor may be provided on an opposite side of the first transistor with respect to the display element.

The first, second, and third transistors may have the same channel type.

According to another exemplary embodiment of the present invention, an organic EL display panel includes a pixel circuit which includes a first transistor having a main electrode and a control electrode, and configured to output a current corresponding to a voltage between the main electrode and the control electrode to a display element. A capacitor is formed between the main electrode and the control electrode. The pixel circuit also includes a second transistor having a control electrode coupled to the control electrode of the first transistor, a third transistor for applying a data line voltage from a data line to the second transistor in response to a select signal provided by a current scan line, and a fourth transistor for applying a pre-charge voltage to the control electrode of the first transistor in response to a select signal provided by a previous scan line. The organic EL display panel includes a control electrode line coupled to a main electrode of the fourth transistor, the control electrode of the first transistor, and the control electrode of the second transistor, and a power electrode line provided substantially in parallel with the data line, and coupled to the main electrode of the first transistor. A channel of the first transistor and a channel of the second transistor are formed substantially in parallel with the current scan line.

A node of the control electrode line for coupling the control electrode of the first transistor to the control electrode of the second transistor may be provided in a direction substantially perpendicular to that of the current scan line, and a portion of the control electrode line coupled to the main electrode of the fourth transistor may be formed substantially in parallel with the power electrode line in a substantially vertical direction. Said portion of the control electrode line may be operated together with a corresponding portion of the power electrode line as a capacitor.

The capacitor may be formed substantially in parallel with the data line, and the display element may be disposed between the capacitor and the data line.

The organic EL display panel may further include a fifth transistor for decoupling the first transistor from the display element in response to a control signal.

A channel of the fifth transistor may be formed substantially in parallel with the data line.

According to yet another exemplary embodiment of the present invention, an arrangement structure for a display panel includes a pixel circuit which includes a first transistor having a main electrode and a control electrode. The first transistor is configured to output a current corresponding to a voltage between the main electrode and the control electrode to a display element. A capacitor is formed between the main electrode and the control electrode. The pixel circuit also includes a second transistor having a control electrode coupled to the control electrode of the first transistor, a third transistor for applying a data line voltage from a data line to the second transistor in response to a select signal provided by a current scan line, and a fourth transistor for applying a pre-charge voltage to the control electrode of the first transistor in response to a select signal provided by a previous scan line. The arrangement structure includes a control electrode line coupled to a main electrode of the fourth transistor, the control electrode of the first transistor, and the control electrode of the second transistor, and a power electrode line provided substantially in parallel with the data line, and coupled to the main electrode of the first transistor. A channel of the first transistor and a channel of the second transistor are formed substantially in parallel with the current scan line. A node of the control electrode line for coupling the control electrode of the first transistor to the control electrode of the second transistor is arranged in a direction substantially perpendicular to that of the current scan line, and a portion of the control electrode line coupled to the main electrode of the fourth transistor is formed substantially in parallel to the power electrode line in a substantially vertical direction.

The first, second, third, and fourth transistors may have the same channel type.

According to yet another exemplary embodiment of the present invention, an organic EL display panel includes a plurality of scan lines, a plurality of data lines, a plurality of control electrode lines, a plurality of power electrode lines and a plurality of pixel circuits. Each said pixel circuit is coupled to a corresponding said scan line, a corresponding said data line, a corresponding said control electrode line and a corresponding said power electrode line. Each said pixel circuit includes a display element, and a first transistor having a main electrode coupled to the corresponding said power electrode line and a control electrode coupled to the corresponding said control electrode line. The first transistor outputs a current corresponding to a voltage between the main electrode and the control electrode to the display element. The organic EL display panel also includes a second transistor having a control electrode coupled to the control electrode of the first transistor, and a third transistor coupled to the corresponding said scan line and the corresponding said data line for applying a data line voltage from the corresponding said date line to a main electrode of the second transistor in response to a select signal provided by the corresponding said scan line. At least a portion of the corresponding said control electrode line is disposed substantially parallel to at least a portion of the corresponding said power electrode line to form a capacitor between the main electrode and the control electrode of the first transistor.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive.

Figure 1:
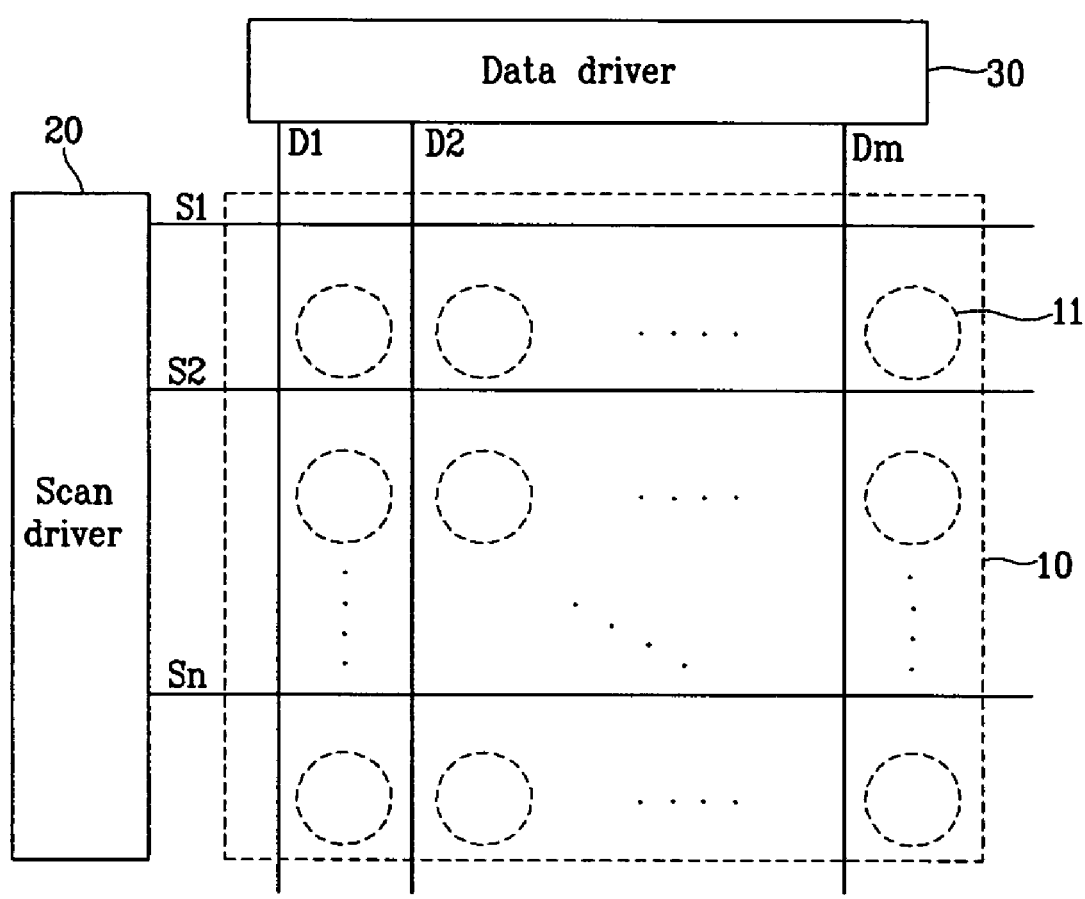
FIG. 1 shows a brief diagram of a general organic EL display.
Figure 2:
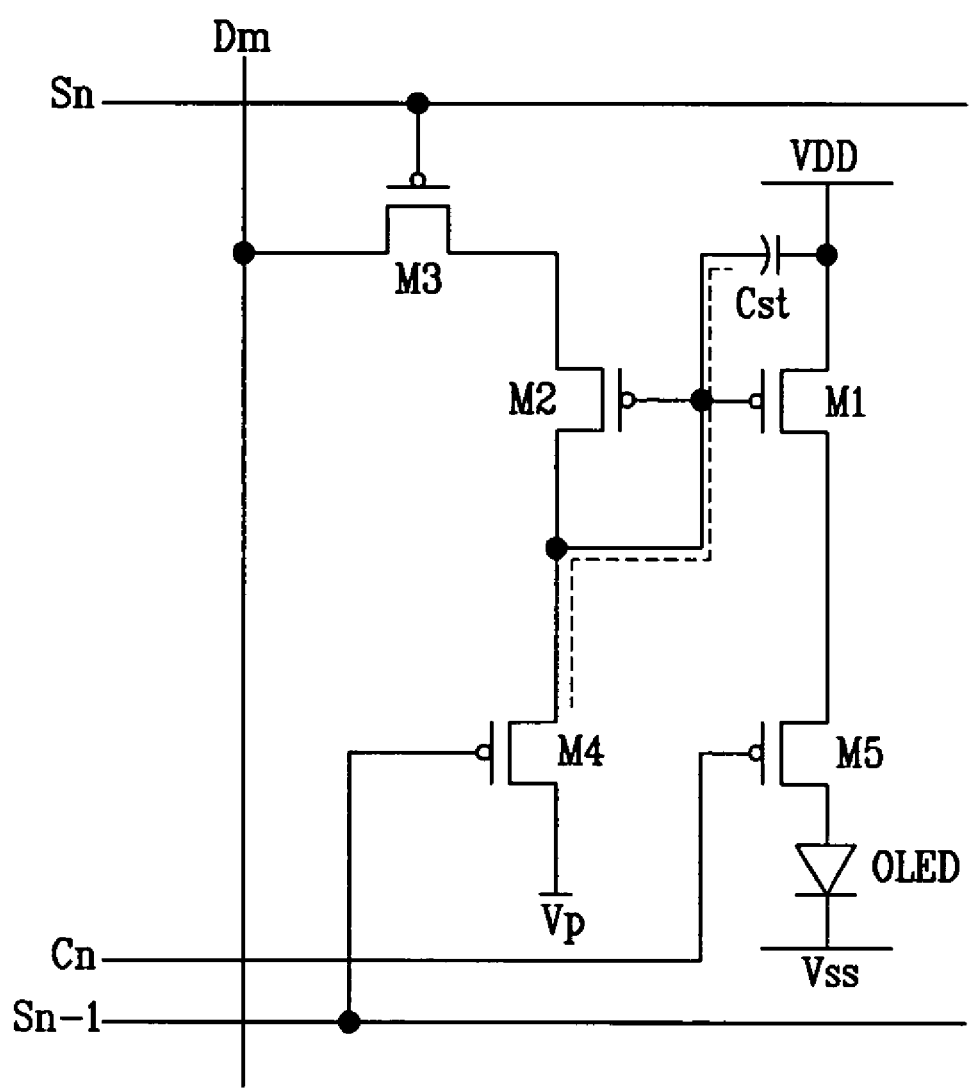
FIG. 2 shows an equivalent circuit diagram of a pixel circuit for driving an organic EL display panel.

For ease of description in FIG. 2, the pixel circuit coupled to the $m^{th}$ data line $D_m$ and the $n^{th}$ scan line $S_n$ is illustrated. Further as to the definitions of the scan line, a scan line which is transmitting the current select signal is referred to as a "current scan line," and a scan line which transmitted the select signal before the current select signal is transmitted is referred to as a "previous scan line."

As shown in FIG. 2, the pixel circuit 11 includes an organic EL element (OLED), transistors M1 to M5, and a capacitor Cst. The transistors M1 to M5 are MOS transistors. In the described embodiment, the transistors M1 to M5 are TFTs which have a gate electrode, a drain electrode, and a source electrode formed on a glass substrate of the display panel 10 as a control electrode and two main electrodes. The transistors M1 to M5 may be any other suitable type of transistors in other embodiments.

The driving transistor M1 has a source coupled to a power supply voltage VDD, and has a capacitor Cst between a gate and the source thereof.

The capacitor Cst maintains a gate-source voltage $V_{GS}$ of the transistor M1 for a predetermined time.

The compensation transistor M2 is diode-connected, and a gate of the compensation transistor M2 is coupled to the gate of the driving transistor M1.

The switching transistor M3 transmits the data voltage provided by the data line $D_m$ to the compensation transistor M2 in response to the select signal provided by the current scan line $S_n$. A drain of the compensation transistor M2 is coupled to a drain of a pre-charge transistor M4.

The pre-charge transistor M4 transmits a pre-charge voltage $V_p$ to the compensation transistor M2 in response to the select signal provided by the previous scan line $S_{n-1}$.

The transistor M5 decouples the driving transistor M1 from the OLED in response to a high-level control signal provided by a control line $C_n$.

The OLED has a cathode coupled to a reference voltage $V_{SS}$, and emits light corresponding to the applied current. The reference voltage $V_{SS}$ is less than the power supply voltage VDD, and may be a ground voltage.

In the pixel circuit described above, the gate of the compensation transistor M2 is coupled to the gate of the driving transistor M1. A node substantially aligned with and coupled to the gates is coupled to a first end of the capacitor Cst and the drain of the pre-charge transistor M4. The gate of the pre-charge transistor M4 is connected to the previous scan line $S_{n-1}$, and the source of the pre-charge transistor M4 is coupled to the pre-charge voltage Vp. In addition to this, the compensation transistor M2 is diode-connected to the switching transistor M3, and the gate of the switching transistor M3 is coupled to the current scan line $S_n$.

While the pre-charge transistor M4 is coupled to the previous scan line in the described embodiment, it can be coupled to an additional control line in other embodiments.

Figure 3:
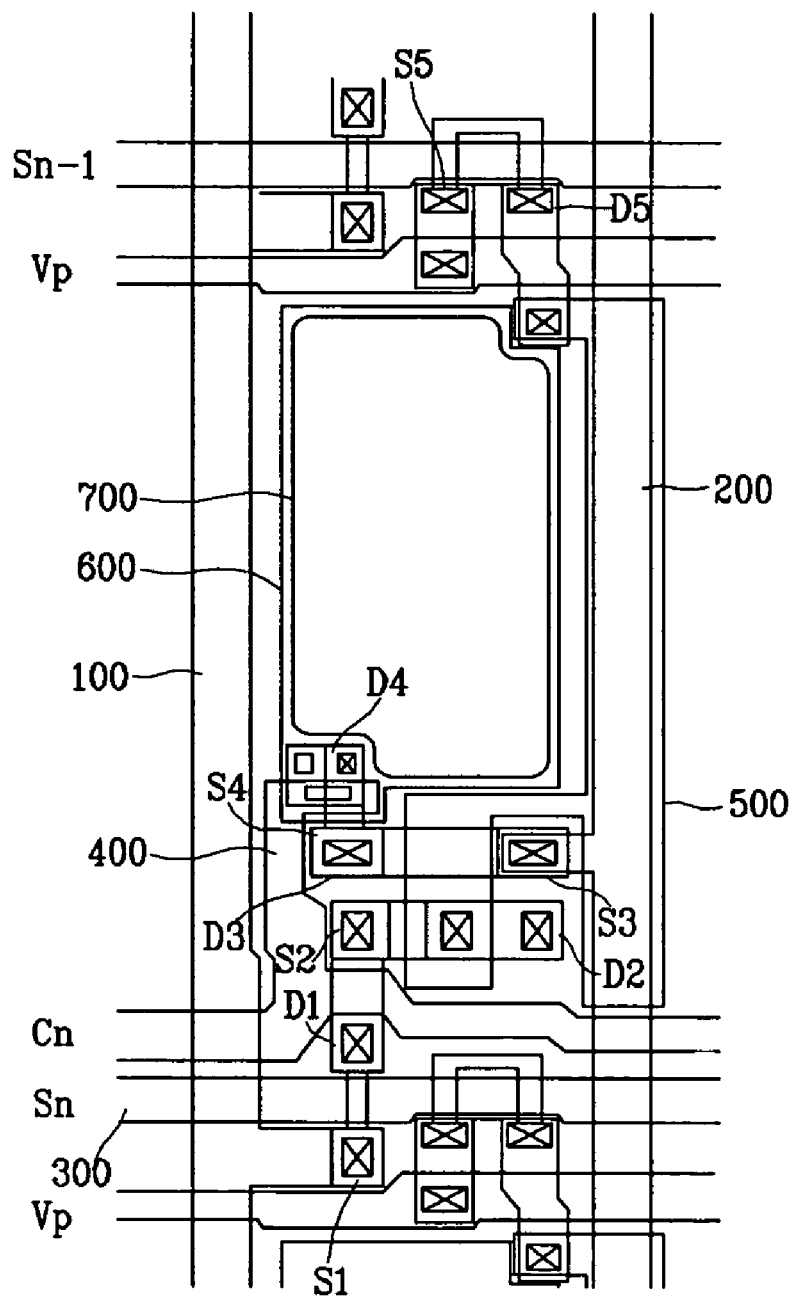
FIG. 3 shows a brief arrangement diagram of the pixel circuit of FIG. 2 according to an exemplary embodiment of the present invention.

As shown in FIG. 3, a data line 100 is provided in the vertical direction, and a power electrode line 200 is provided substantially in parallel with the data line 100, allowing an organic EL element layer 700 to be disposed between the data line 100 and the power electrode line 200. A scan line $S_n$ 300 extends in substantially the horizontal direction, and crosses the data line 100 in the vertical direction.

A source S1 of the switching transistor M3 is coupled to the data line 100, and a drain D1 is provided on the opposite side of the source S1 with respect to the scan line $S_n$. A channel formed between the source S1 and the drain D1 is provided substantially in parallel with the data line 100, and a gate provided on the channel is coupled to the scan line 300.

A source S2 of the compensation transistor M2 is coupled to the drain D1 of the switching transistor M3, and a drain D2 is provided in pair with the source S2 to form a channel substantially in parallel with the scan line 300.

A drain D3 and a source S3 of the driving transistor M1 are provided to have substantially the same channel direction as the channel direction formed by the source S2 and the drain D2 of the compensation transistor M2. In other words, the channel formed between the source S3 and the drain D3 is provided substantially in parallel with the scan line $S_n$.

In the pixel circuit 11, the gate of the compensation transistor M2 is coupled to the gate of the driving transistor M1, and a capacitor (Cst of FIG. 2) is formed between the source S3 and the gate of the driving transistor M1 (indicated by a dotted line in FIG. 2). Therefore, the gates of the driving transistor M1 and the compensation transistor M2 with the channels formed substantially in parallel with each other are coupled together in a direction which is substantially perpendicular to the channel direction.

The source S3 of the driving transistor M1 is coupled to the power electrode line 200, and the gate of the driving transistor M1 is formed below the power electrode line 200 and substantially in parallel with the power electrode line 200 in the vertical direction so that the gate thereof and the power electrode line 200 may form a capacitor. Therefore, a gate coupling line 500 which is a control electrode line for forming the coupled configuration of the gate of the compensation transistor M2 and the gate of the driving transistor M1 and the configuration of the formed capacitor between the source S3 and the gate of the driving transistor M1, is generated.

The transistor M5 is a PMOS transistor in the same manner as the transistors M1 to M4. A source S4 of the transistor M5 is coupled to a drain D3 of the driving transistor M1, and a drain D4 of the transistor M5 is coupled to a pixel electrode 600 through an access point so that the channel of the transistor M5 is formed substantially in parallel with the data line 100. A gate of the transistor M5 is coupled to a control line $C_n$ 400.

An organic EL element 700 which is a display element is formed on the upper part of the pixel electrode 600.

In detail, the channel of the driving transistor M1 and the channel of the compensation transistor M2 are provided substantially in parallel with the respective scan lines, and the channel of the transistor M5 is provided substantially in parallel with the data line.

The gate of the driving transistor M1 and the gate of the compensation transistor M2 are coupled by the gate coupling line 500 which is a control electrode line, and the gate coupling line 500 reaches the drain of the pre-charge transistor M4 so as to apply the pre-charge voltage $V_p$ to the gate of the driving transistor M1 in response to the select signal of the previous scan line $S_{n-1}$.

In this instance, a portion (which forms the node between the transistors M1 and M2) of the gate coupling line 500 which is substantially aligned with and coupled to both the gate of the driving transistor M1 and the gate of the compensation transistor M2 is formed in the direction which is substantially perpendicular to the direction of the scan lines, and the portion of the gate coupled line 500 extended to the drain of the pre-charge transistor M4 is formed substantially in parallel with the power electrode line 200 in the vertical direction.

As a result, the gate of the driving transistor M1, the gate of the compensation transistor M2, and the drain D5 of the pre-charge transistor M4 are coupled together by the gate coupling line 500. A source S5 of the pre-charge transistor M4 is coupled to a pre-charge voltage line $V_p$. The power electrode line 200 coupled to the source S3 of the driving transistor M1 is established to be an electrode and the gate coupling line 500 is set to be another electrode to thus form the capacitor Cst.

The above-configured pixel circuit significantly reduces or minimizes the areas where the respective transistors are formed to thereby obtain a full area to be occupied by the display element and improve the aperture ratio of the pixels.

While this invention has been described in connection with certain exemplary embodiments, it is to be understood that the invention is not limited to the disclosed embodiments, but, on the contrary, is intended to cover various modifications included within the spirit and scope of the appended claims, and equivalents thereof.

According to the present invention, the channel of the driving transistor M1 and the channel of the compensation transistor M2 are formed substantially in parallel with the scan lines, the channel of the transistor M5 is formed substantially in parallel with the data line, the part of the gate coupling line 500 at which the gate of the driving transistor M1 and the gate of the compensation transistor M2 are coupled is substantially perpendicularly formed with respect to the scan line, and the part extended to the pre-charge transistor M4 is formed substantially in parallel with the power electrode line 200 in the vertical direction, and hence, the area occupied by the circuit is significantly reduced or minimized to obtain the area occupied by the display element, thereby improving the aperture ratio of the pixels.

Also, the gate coupling line 500 and the power electrode line 200 are formed substantially in parallel in the vertical direction, and are operated as a capacitor Cst, and accordingly, the aperture ratio of the pixels is improved.

What is claimed is:

1. An organic electroluminescent (EL) display panel comprising a display element including a pixel electrode and a pixel circuit which includes: a first transistor having a main electrode and a control electrode, and configured to output a current corresponding to a voltage between the main electrode and the control electrode to the pixel electrode of the display element; a second transistor having a main electrode and a control electrode coupled to the control electrode of the first transistor; and a third transistor for applying a data line voltage from a data line to the second transistor in response to a select signal provided by a current scan line, the organic EL display panel comprising:
   a power electrode line substantially in parallel with the data line, and coupled to the main electrode of the first transistor; and
   a control electrode line comprising a first portion substantially aligned with and coupled to the control electrode of the first transistor and the control electrode of the second transistor and a second portion coupled to the first portion, the second portion extending substantially parallel to the power electrode line and overlapping at least a portion of the power electrode line for at least a whole length of the pixel electrode to form a capacitor between the main electrode and the control electrode of the first transistor, wherein the control electrode line is coupled to the main electrode of the second transistor so as to diode-connect the second transistor, wherein
   a channel of the first transistor and a channel of the second transistor are formed substantially in parallel with the current scan line.

2. The organic EL display panel of claim 1, wherein the first portion of the control electrode line for coupling the control electrode of the first transistor to the control electrode of the second transistor extends in a direction substantially perpendicular to that of the current scan line.

3. The organic EL display panel of claim 1, wherein the capacitor is formed substantially in parallel with the data line, and the display element is at a region between the capacitor and the data line.

4. The organic EL display panel of claim 1, wherein the first, second, and third transistors have the same channel type.

5. An organic electroluminescent (EL) display panel comprising a display element including a pixel electrode and a pixel circuit which includes: a first transistor having a main electrode and a control electrode, and configured to output a current corresponding to a voltage between the main electrode and the control electrode to the pixel electrode of the display element; a second transistor having a control electrode coupled to the control electrode of the first transistor; and a third transistor for applying a data line voltage from a data line to the second transistor in response to a select signal provided by a current scan line, the organic EL display panel comprising:
   a power electrode line substantially in parallel with the data line, and coupled to the main electrode of the first transistor;
   a control electrode line comprising a first portion substantially aligned with and coupled to the control electrode of the first transistor and the control electrode of the second transistor and a second portion coupled to the first portion, the second portion extending substantially parallel to the power electrode line and overlapping at least a portion of the power electrode line for at least a whole length of the pixel electrode to form a capacitor between the main electrode and the control electrode of the first transistor; and
   a fourth transistor for applying a pre-charge voltage to a main electrode of the second transistor and the control electrode of the first transistor in response to a control signal, wherein
   a channel of the first transistor and a channel of the second transistor are formed substantially in parallel with the current scan line.

6. The organic EL display panel of claim 5, wherein the fourth transistor is located on an opposite side of the first transistor with respect to the display element.

7. An organic electroluminescent (EL) display panel comprising a display element including a pixel electrode and a pixel circuit which includes: a first transistor having a main electrode and a control electrode, and configured to output a current corresponding to a voltage between the main electrode and the control electrode to the pixel electrode of the display element; a second transistor having a control electrode coupled to the control electrode of the first transistor; a third transistor for applying a data line voltage from a data line to the second transistor in response to a select signal provided by a current scan line; and a fourth transistor for applying a pre-charge voltage to the control electrode of the first transistor in response to a select signal provided by a previous scan line, the organic EL display panel comprising:
   a power electrode line substantially in parallel with the data line, and coupled to the main electrode of the first transistor; and
   a control electrode line coupled to a main electrode of the fourth transistor, the control electrode of the first transistor, and the control electrode of the second transistor, the control electrode line comprising a portion that extends substantially parallel to the power electrode line and overlapping at least a portion of the power electrode line for at least a whole length of the pixel electrode to form a capacitor between the main electrode and the control electrode of the first transistor, wherein
   a channel of the first transistor and a channel of the second transistor are formed substantially in parallel with the current scan line.

8. The organic EL display panel of claim 7, wherein a portion of the control electrode line for coupling the control electrode of the first transistor to the control electrode of the second transistor is elongated in a direction substantially perpendicular to an extending direction of the current scan line.

9. The organic EL display panel of claim 8, wherein the capacitor is formed substantially in parallel with the data line, and the display element is at a region between the capacitor and the data line.

10. The organic EL display panel of claim 8, further comprising a fifth transistor for decoupling the first transistor from the display element in response to a control signal.

11. The organic EL display panel of claim 10, wherein a channel of the fifth transistor is formed substantially in parallel with the data line.

12. An arrangement structure for a display panel comprising a display element including a pixel electrode and a pixel circuit which includes: a first transistor having a main electrode and a control electrode, and configured to output a current corresponding to a voltage between the main electrode and the control electrode to the pixel electrode of the display element; a second transistor having a control. electrode coupled to the control electrode of the first transistor; a third transistor for applying a data line voltage from a data line to the second transistor in response to a select signal provided by a current scan line; and a fourth transistor for applying a pre-charge voltage to the control electrode of the first transistor in response to a select signal provided by a previous scan line, the arrangement structure comprising:

a power electrode line substantially in parallel with the data line, and coupled to the main electrode of the first transistor; and a control electrode line coupled to a main electrode of the fourth transistor, the control electrode of the first transistor, and the control electrode of the second transistor, the control electrode line comprising a portion that extends substantially parallel to the power electrode line and overlapping at least a portion of the power electrode line for at least a whole length of the pixel electrode to form a capacitor between the main electrode and the control electrode of the first transistor, wherein a channel of the first transistor and a channel of the second transistor are formed substantially in parallel with the current scan line, and a portion of the control electrode line for coupling the control electrode of the first transistor to the control electrode of the second transistor is elongated in a direction substantially perpendicular to an extending direction of the current scan line.

13. The arrangement structure of claim 12, wherein the first, second, third, and fourth transistors have the same channel type.

14. An organic electroluminescent (EL) display panel comprising a plurality of scan lines, a plurality of data lines, a plurality of control electrode lines, a plurality of power electrode lines and a plurality of pixel circuits, each said pixel circuit coupled to a corresponding said scan line, a corresponding said data line, a corresponding said control electrode line and a corresponding said power electrode line, and comprising:

a display element comprising a pixel electrode;

a first transistor having a main electrode coupled to the corresponding said power electrode line and a control electrode coupled to the corresponding said control electrode line, the first transistor for outputting a current corresponding to a voltage between the main electrode and the control electrode to the pixel electrode of the display element;

a second transistor having a control electrode coupled to the control electrode of the first transistor; and a third transistor coupled to the corresponding said scan line and the corresponding said data line for applying a data line voltage from the corresponding said data line to a main electrode of the second transistor in response to a select signal provided by the corresponding said scan line, wherein at least a portion of the corresponding said control electrode line extends substantially parallel to the corresponding said power electrode line and overlaps at least a portion of the corresponding said power electrode line for at least a whole length of the pixel electrode to form a capacitor between the main electrode and the control electrode of the first transistor.

15. The organic EL display panel of claim 14, wherein a portion of the corresponding said control electrode line for coupling the control electrode of the first transistor to the control electrode of the second transistor is elongated in a direction substantially perpendicular to an extending direction of the corresponding said scan line.

16. The organic EL display panel of claim 14 wherein the capacitor is formed substantially in parallel with the corresponding said data line, and the display element is at a region between the capacitor and the corresponding said data line.

17. The organic EL display panel of claim 14, wherein the second transistor is diode-connected and each said pixel circuit further comprises a fourth transistor coupled between a pre-charge voltage and the control electrode of the second transistor to provide the pre-charge voltage to the control electrode of the second transistor in response to a select signal provided by a previous said scan line.

18. The organic EL display panel of claim 17, further comprising a fifth transistor coupled between the first transistor and the display element to electrically decouple the first transistor from the display element in response to a control signal from a corresponding one of a plurality of control lines in the organic EL display panel.

19. The organic EL display panel of claim 14, wherein a channel of the first transistor and a channel of the second transistor are formed substantially in parallel with the corresponding said scan line.

* * * * *